(12) United States Patent
Kay et al.

(10) Patent No.: US 6,564,357 B2
(45) Date of Patent: May 13, 2003

(54) PERFORMANCE VERIFICATION/ANALYSIS TOOL FOR FULL-CHIP DESIGNS

(75) Inventors: Rony Kay, Cupertino, CA (US); Sreenath Kurupati, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/820,876

(22) Filed: Mar. 30, 2001

(65) Prior Publication Data

US 2002/0144225 A1 Oct. 3, 2002

(51) Int. Cl.[7] .............................................. G06F 17/50
(52) U.S. Cl. ............................................ 716/4; 716/6
(58) Field of Search ............................ 716/4, 5, 6, 16; 703/14, 15

(56) References Cited

U.S. PATENT DOCUMENTS

| | | | | |
|---|---|---|---|---|
| 5,844,818 A | * | 12/1998 | Kochpatcharin et al. ....... | 716/4 |
| 5,901,063 A | * | 5/1999 | Chang et al. .................. | 716/4 |
| 6,018,623 A | * | 1/2000 | Chang et al. .................. | 716/6 |
| 6,233,724 B1 | * | 5/2001 | LaBerge ........................ | 716/6 |
| 6,253,358 B1 | * | 6/2001 | Takahashi ...................... | 716/6 |
| 6,272,668 B1 | * | 8/2001 | Teene ............................ | 716/6 |
| 6,314,546 B1 | * | 11/2001 | Muddu ........................... | 716/5 |
| 6,327,693 B1 | * | 12/2001 | Cheng et al. .................. | 716/5 |

\* cited by examiner

Primary Examiner—Tuan T. Lam
Assistant Examiner—Terry L. Englund
(74) Attorney, Agent, or Firm—Antonelli, Terry, Stout & Kraus, LLP

(57) ABSTRACT

A method and apparatus may be provided for providing performance verification/analysis of a full-chip design. This may include performing an analysis on a first block of the full-chip design. Data (such as a waveform output from a pin of the block) may be captured while performing the analysis. This captured data may be utilized when performing an analysis of the full-chip design. Features of an interconnect between the first block and a second block may be determined using the captured data.

19 Claims, 7 Drawing Sheets

PERFORMANCE VERIFICATION/ANALYSIS TOOL FOR FULL-CHIP DESIGNS

FIELD

The present invention is directed to performance analysis and verification of full-chip designs.

BACKGROUND

Performance analysis/verification is an aspect of integrated circuit design in which a model of the integrated circuit is tested to determine whether it meets specified performance criteria.

Performance analysis/verification of an integrated circuit chip model may be performed in a hierarchical manner. For example, during a first pass, individual cells of the integrated circuit may be tested against desired performance goals for the individual cells. For subsequent passes, testing may then proceed at the block level and finally, at the full chip level, to determine if the overall chip meets desired performance criteria.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto.

The following represents brief descriptions of the drawings wherein like reference numerals represent like elements and wherein.

DETAILED DESCRIPTION

Figure 1:
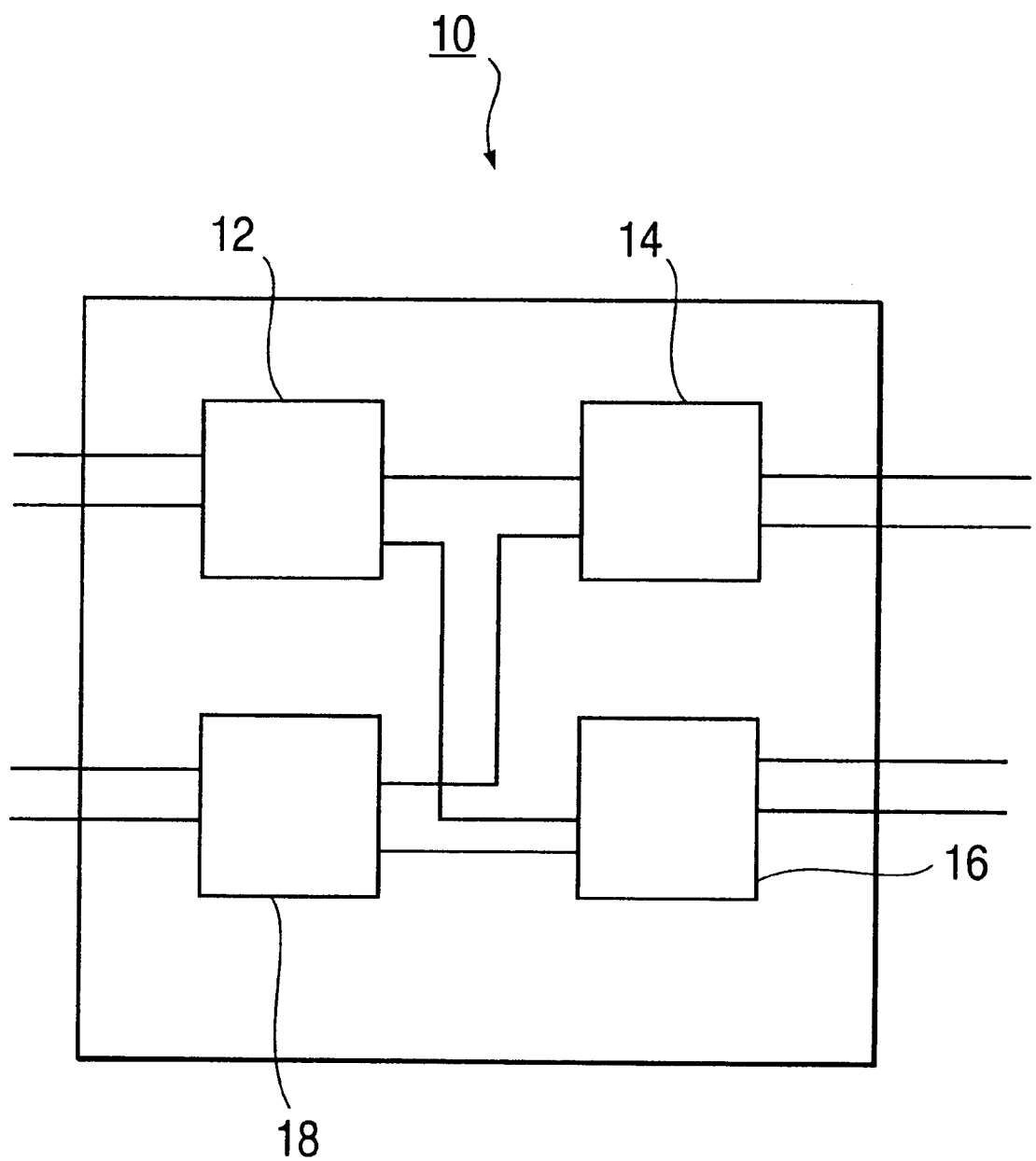
FIG. 1 is an example chip design having four functional blocks.

Before beginning a detailed description of the subject invention, mention of the following is in order. When appropriate, like reference numerals and characters may be used to designate identical, corresponding or similar components in differing figure drawings. Well known power/ground connections to integrated circuits (ICs) and other components may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements may be dependent upon the platform within which embodiments of the present invention are to be implemented. That is, such specifics should be well within the purview of one skilled in the art. Where specific details (e.g., circuits, flowcharts) are set forth in order to describe example embodiments of the invention, it should be appreciated to one skilled in the art that the invention can be practiced without, or with variation of, these specific details. Finally, it should be appreciated that differing combinations of hard-wired circuitry and software instructions may be used to implement embodiments of the present invention. That is, the present invention is not limited to any specific combination of hardware and software.

Any reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Arrangements and embodiments will hereafter be described with respect to electrical models of logic components and integrated circuits. Although electrical diagrams may be shown in the accompanying figures, it is understood to one skilled in the art that these figures represent electrical designs or electrical models provided on or within a computer system. The computer system and software to be described, function as a design tool for performance analysis/verification of the full-chip design.

FIG. 1 shows an example full-chip design 10 having four blocks, namely a first block 12, a second block 14, a third block 16 and a fourth block 18. The blocks may be interconnected as shown in FIG. 1 or by any other combination of connections between the respective blocks. One skilled in the art would understand that only a portion of the full-chip design is shown in the figures.

The full-chip design 10 may represent an electrical unit, an electrical cluster, an integrated circuit (such as a microprocessor), a full-chip or a system, for example. Each of the blocks 12, 14, 16 and 18 may represent a block of logical/electrical components. The blocks 12, 14, 16 and 18 may also represent a functional unit or a logical unit of the design 10.

Figure 2:
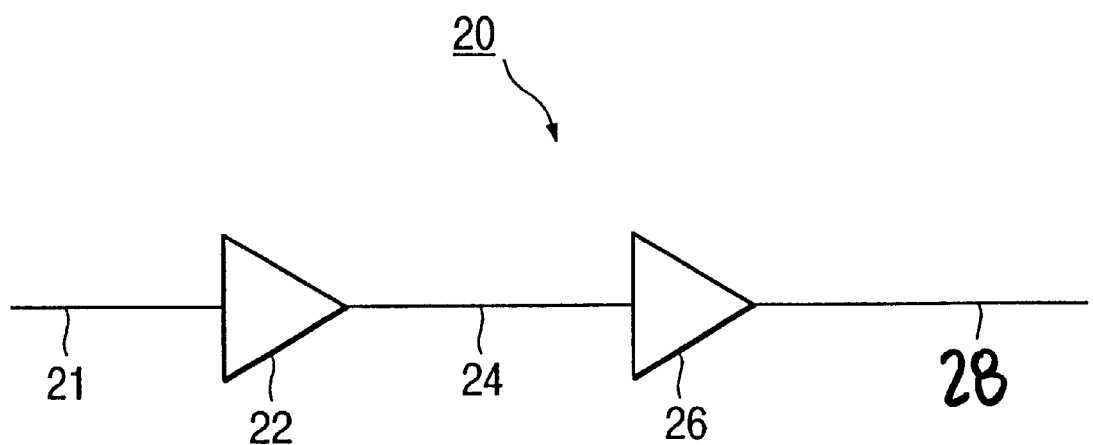
FIG. 2 is an example driver-receiver implementation.

FIG. 2 shows an example driver-receiver implementation 20. The model of the implementation 20 corresponds to a stage between blocks in a full-chip design as will be described below. More specifically, FIG. 2 shows a signal line 21 input to a driver device 22. A signal line 24 is coupled to an output of the driver device 22 and to an input of a receiver device 26. A signal line 28 is coupled to an output of the receiver device 26.

Figure 3:
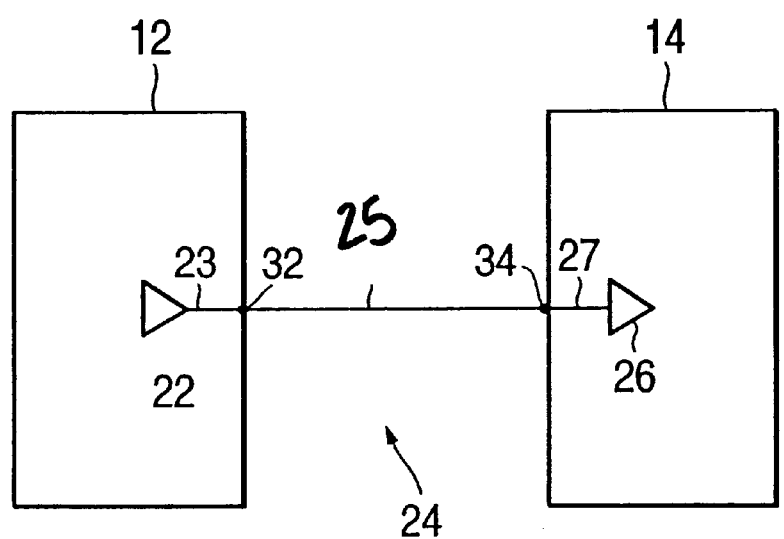
FIG. 3 is a diagram of one stage of the chip design of FIG. 1.

FIG. 3 is a diagram of one stage of the full-chip design 10 shown in FIG. 1 and similarly corresponds to the driver-receiver implementation 20 shown in FIG. 2. More specifically, FIG. 3 shows the connections between the first block 12 and the second block 14. The first block 12 includes the driver device 22 and the second block 14 includes the receiver device 26. The first block 12 and the second block 14 may be coupled together by the signal line 24 provided between the driver device 22 and the receiver device 26. Other connections to the first block 12 and the second block 14 are not shown for ease of illustration. For purposes of the following discussion, the design of the signal line 24 may be virtually broken into several sections, namely a signal line 23, a signal line 25 and a signal line 27. The signal line 23 is an intrawiring of the first block 12 between the driver device 22 and a pin 32. Similarly, the signal line 27 is an intrawiring of the second block 14 between a pin 34 and the receiver device 26. A block wiring may be the signal line 25 provided between the pin 32 of the block 12 and the pin 34 of the block 14.

Performance analysis/verification may be performed at a lower level for each of the blocks 12, 14, 16 and 18 using an appropriate computer system running a performance verification/analysis tool on a model of the chip design. Performance analysis/verification may involve determining parameters of signals through the various electrical components of a block. These parameters may include, for example, timing of signals, strength of signals and slope of signals. After performing the lower level performance analysis/verification and determining that each of the individual blocks satisfies certain performance criteria, testing may proceed to a higher level, namely a full-chip analysis (or system analysis). For full-chip performance analysis/verification, the full-chip design 10 may be tested to determine if it meets performance criteria. Stated differently, performance analysis/verification may proceed in a hierarchical manner by starting at a lower level (e.g., logical component level) and proceeding to higher levels (such as functional blocks and later to the full-chip testing). For one embodiment, the full-chip level analysis/verification may be accomplished by using data or parameters that were obtained during lower level performance verification/analysis. This previously obtained data may be combined with data regarding the various interconnects between the blocks within the design 10.

As technology has progressed, and with the increasing non-linearity of major electrical components, the signal delay of the interconnects between the blocks cannot be considered negligible. It is therefore desirable to perform interblock analysis/verification by combining behavioral models obtained from the block level analysis with the interconnect (i.e., wiring) parasitics between the blocks and then calculating the corresponding delays.

Figure 4:
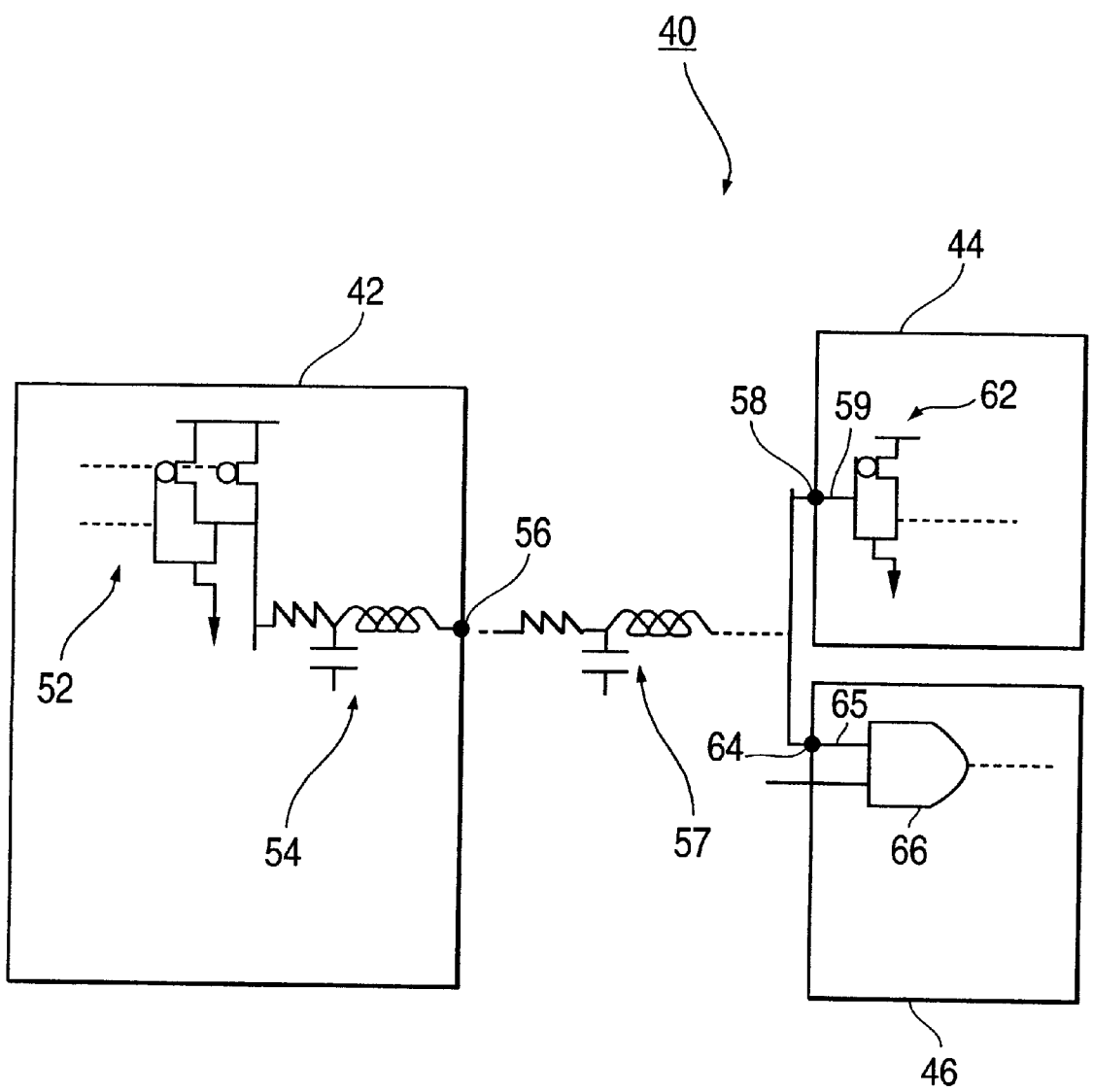
FIG. 4 is a model of the chip design for full-chip verification/analysis.

FIG. 4 shows a model 40 of a full-chip design that may be provided within a computer system. The model and design may include a first block 42, a second block 44 and a third block 46. In this example model, the first block 42 may include a driver device 52 coupled to intrablock wiring 54, which is coupled to a pin 56. The driver 52, the intrablock wiring 54 and the pin 56 may correspond to the driver device 22, the signal line 23 and the pin 32 respectively shown in FIG. 3. The intrablock wiring 54 may include an RLC network as shown in FIG. 4. The second block 44 may include a pin 58 coupled to intrablock wiring 59 and a receiver device 62. Similarly, the third block 46 may include a pin 64 coupled to intrablock wiring 65 and a receiver device 66. FIG. 4 additionally includes an interblock wiring (or interconnect 57) coupled between the pin 56 and each of the pins 58 and 64. In this example, the interblock wiring (or interconnect 57) is an RLC network although other types of interconnects and wiring are also possible. This FIG. represents a model of the full-chip design that will be tested by a computer system having the appropriate software routine to perform the performance verification/analysis. The model of the design may be stored within any number of well known storage media.

Disadvantageous arrangements for interblock analysis/verification may include models of drivers (e.g. transistor level models or Thevenin-like models or precharacterized gate models, etc.) and the wires coupled between the drivers and their corresponding output pins. Driver information may be abstracted from the respective blocks and stored with the intrablock and interblock interconnect parasitics. Thus, to perform interblock performance/analysis, several disparate pieces of information may be stitched across different levels of hierarchy to form driver/interconnect/load circuit configurations (i.e., stages) for which delay values can be calculated (e.g. by simulation or solving circuit equations). However, stitching the data and calculating the delays may be a complex and error-prone process due to computational aspects and the need to manage inconsistent data from multiple sources. It is desirable to eliminate and/or minimize the need for extracting, storing and stitching the intrablock data—including the driver and wires—before or during the interblock performance/analysis (e.g. full-chip timing analysis).

Figure 5:
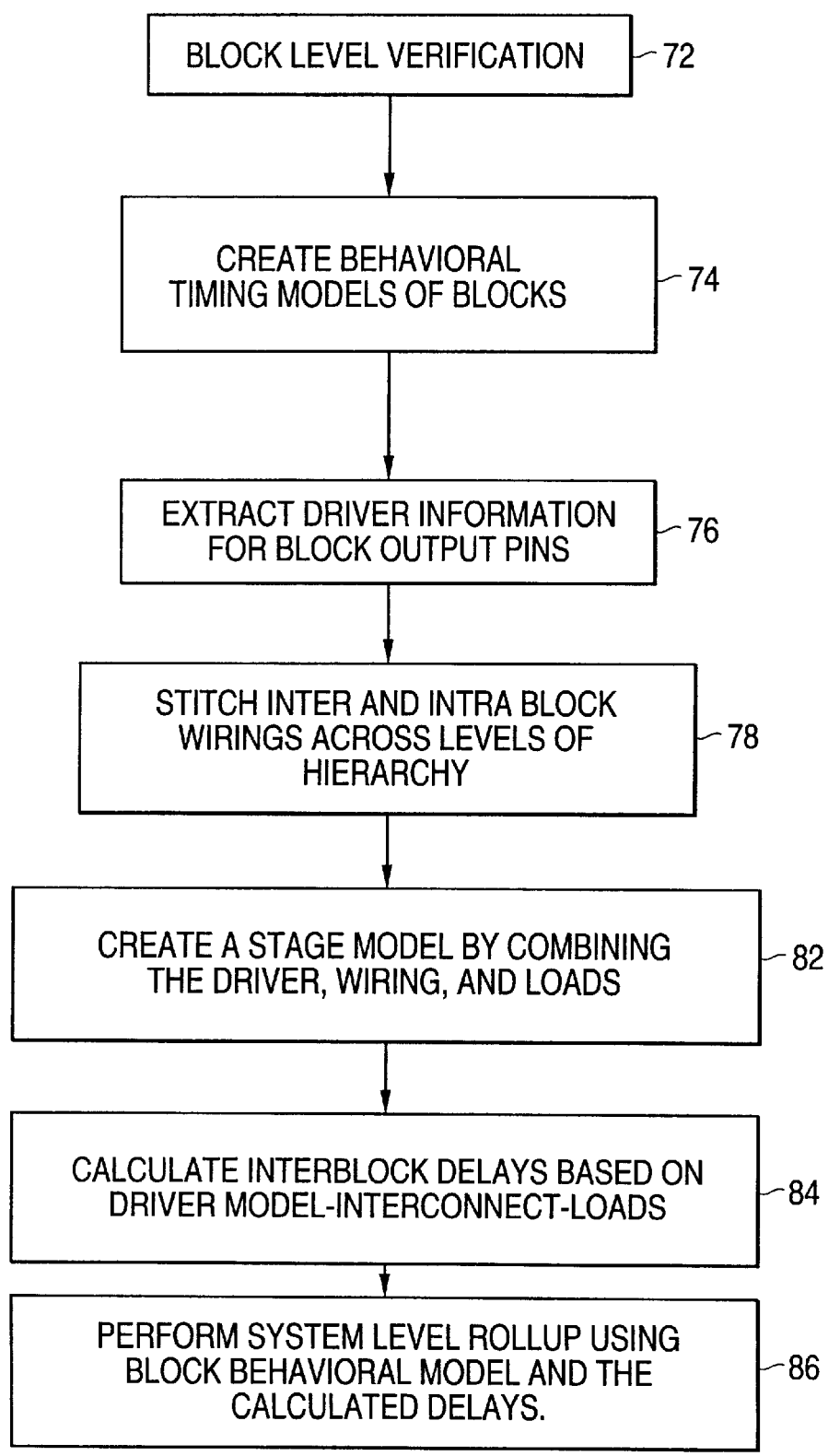
FIG. 5 is a flowchart showing an example method of full-chip verification/analysis.

A disadvantageous arrangement for performing performance verification/analysis of a full-chip design will now be described with respect to the model 40 shown in FIG. 4 and a flow chart 70 shown in FIG. 5. In this disadvantageous arrangement, after individually testing each of the lower level blocks 42, 44 and 46 (block 72 in FIG. 5), testing may occur at a higher level such as at a full-chip level for the full-chip design. This may be accomplished by creating behavioral timing models of the blocks (block 74 in FIG. 5) and extracting driver information for block output pins (block 76 in FIG. 5). During full-chip analysis, features of the interconnect wiring may be determined by analyzing individual stages between blocks. That is, interblock and intrablock wirings may be stitched based on analysis from the block level and used in the full-chip testing (block 78 in FIG. 5). In this arrangement, a stage model may be created by combining the driver, the wiring and loads (block 82) such as shown by the model 40 of FIG. 4. Interblock delays may then be calculated based on the driver model-interconnect-loads (block 84). Finally, the full-chip analysis/verification may be performed using the block behavioral model and the calculated delays (block 86).

In this arrangement, each stage may include the last component (i.e., driver) in a block and the first component (i.e., receiver) within the next block. Therefore, when the overall full-chip performance is analyzed using features of the stage, the features relating to the driver devices, receiver devices, and the intrawiring within each of the individual blocks may be analyzed more than once, namely during the block analysis and during the full-chip analysis. This may additionally involve a significant amount of time.

In contrast, embodiments of the present invention may determine interblock delays (or other features/parameters of the interblock wiring) for performance analysis/verification by using captured waveforms to model the electrical behavior at the block interface (i.e., the output pins). That is, these embodiments may use information that has already been attained or determined in a lower level performance verification/analysis. These embodiments will now be described based on the model 40 (FIG. 4) of a full-chip design. During performance analysis/verification at the block level, relevant waveforms may be stored (i.e., captured). The waveforms may serve as a mathematically equivalent electrical representation of the driver and other interblock parasitics. These stored waveforms may subsequently be used to represent aspects of the electrical behavior of the block. Using the waveforms to model electrical behavior at the block interfaces (i.e., pins) may allow a clear partitioning between block level and interblock level performance analysis/verification. The partitioning may further enable simpler, faster and more efficient delay calculation than existing methods. This analysis relates to the substitution theorem in circuit theory that implies that the response across an electrical network that is driven by a linear or non-linear driver is not affected by substituting the driver with an appropriate time dependent voltage source or time dependent current source that is attached directly to the pin, for example.

Figure 6:
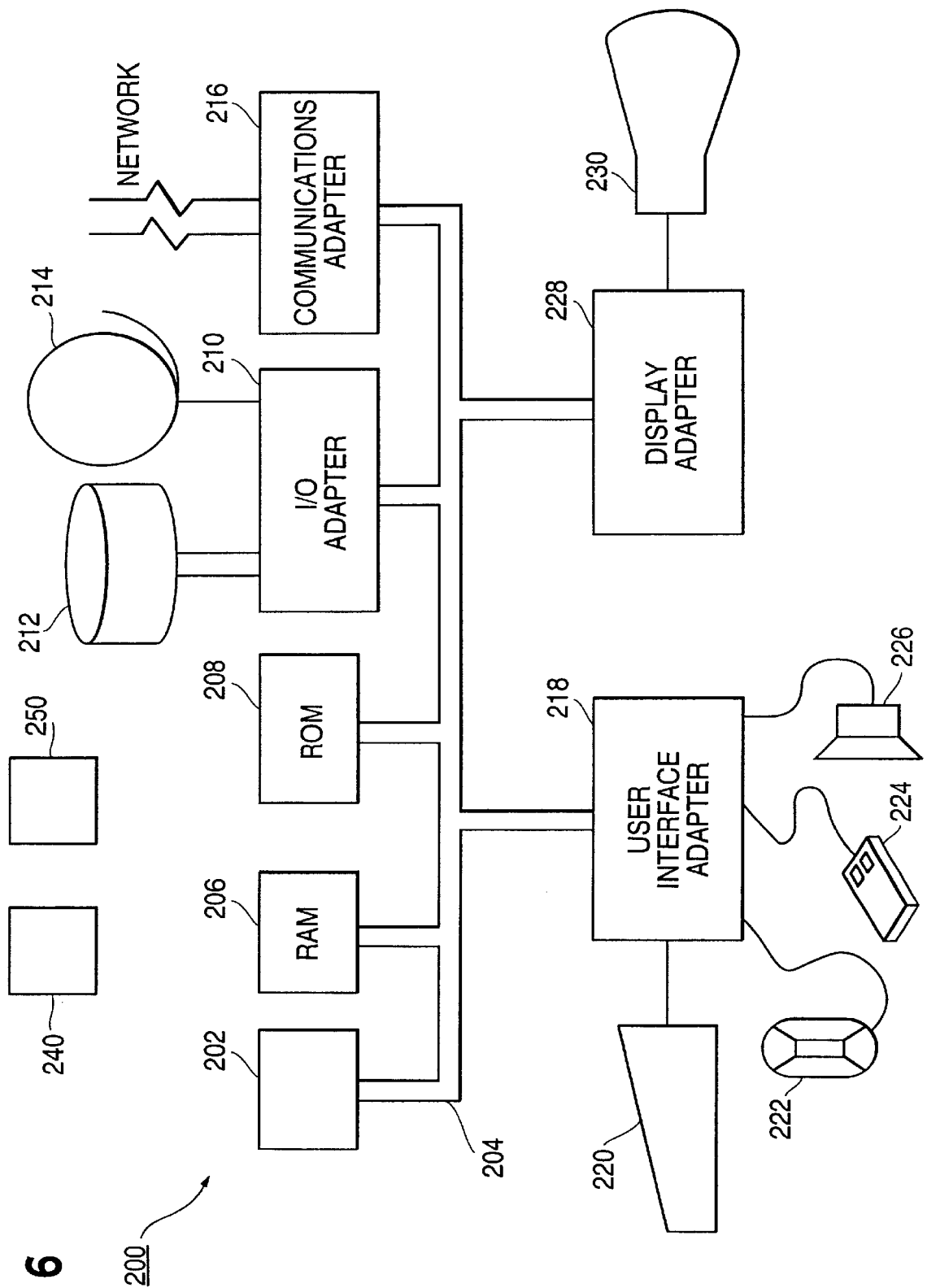
FIG. 6 is a computer system for executing embodiments of the present invention.

FIG. 6 illustrates a computer system 200 to execute example embodiments of the present invention. Other configurations and embodiments are also within the scope of the present invention. The system 200 preferably has at least one processor 202. The processor 202 may be interconnected via a system bus 204 to a random access memory (RAM) 206, read-only memory (ROM) 208, input/output (I/O) adapter 210 (for connecting peripheral devices such as disk units 212 and tape drives 214 to the bus 204), communication adapter 216 (for connecting to a network), user interface adapter 218 (for connecting a keyboard 220, microphone 222, mouse 224, speaker 226 and/or other user interface device to the bus 204), and display adapter 228 (for connecting the bus 204 to a display device 230). FIG. 6 further shows a storage medium 240 containing software for performing verification/analysis embodiments of the present invention and a storage medium 250 containing a model of the full-chip design. The storage mediums 240 and 250 may be loaded into the memory of the system 200. The storage mediums 240 and 250 may be a number of well known means, such as a hard disk, CD ROM, tape, optical disk or provided along a wire from another computer within a network.

Figure 7:
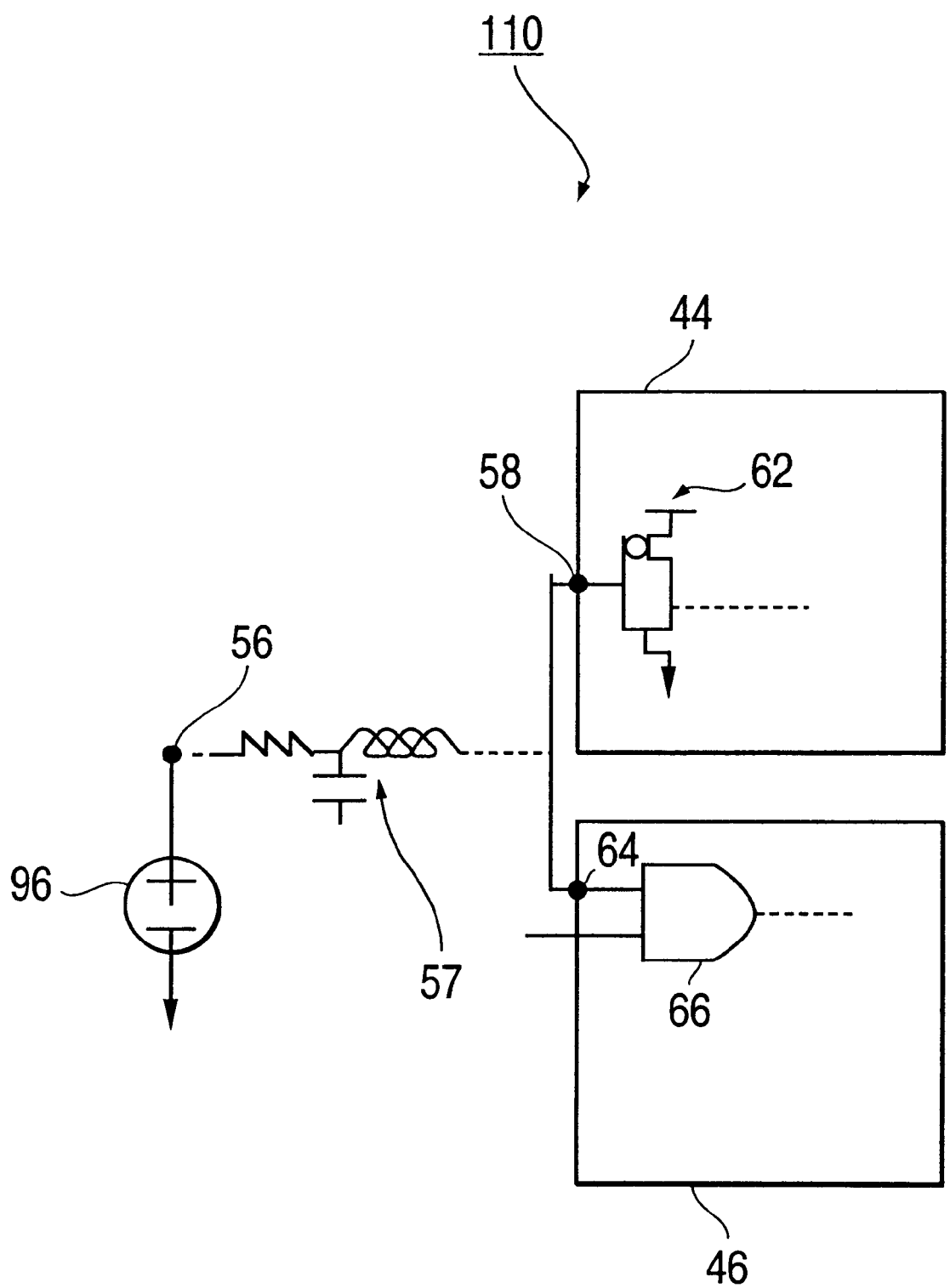
FIG. 7 is a model of the chip design for full-chip verification/analysis according to an example embodiment of the present invention.

FIG. 7 shows a model 110 of the full-chip design according to an example embodiment of the present invention. Again, the model of the full-chip design only represents portions of the actual design. Other embodiments and configurations are also within the scope of the present invention. The model 10 is provided to or is provided within the computer system 200 to perform the performance verification/analysis. As discussed above, the model 110 may be provided on a program storage medium such as the storage medium 250 or in the memory of the computer system 200. More specifically, FIG. 7 shows similar components as in FIG. 4 such as the pin 56 from the first block 42 (not shown in FIG. 7), the interconnect 57, the second block 44 and the third block 46. In this embodiment, the model 110 represents the first block 42 as a time dependent voltage source 96. In this model, the time dependent voltage source 96 provides a waveform at the pin 56 similar to the waveform at the pin 56 in the model 40 of FIG. 4. This waveform will have been captured earlier during the block level analysis. Stated differently, the time dependent voltage source 96 is used in the model to provide a waveform for the performance analysis/verification tool. In other words, the time dependent voltage source 96 replaces the performance of the driver 52 and the intrablock wiring 54 in the model provided within the computer system 200. Accordingly, the performance verification/analysis tool does not need to remodel the first block 42 as shown in FIG. 4 since it has captured its previous output from the pin 56.

Embodiments of the present invention may eliminate several tedious and time consuming processes as compared with existing methods for interblock performance analysis/verification (e.g. full-chip timing). These eliminated or minimized processes may include the extraction and storage of driver and intrablock wiring information; stitching of interconnect across multiple levels of hierarchy; non-linear simulation of drivers; and sensitization of the worse case stimuli for multi-input drivers. The waveforms may be obtained directly from the block level analysis without adding complexity to the overall design flow.

Figure 8:
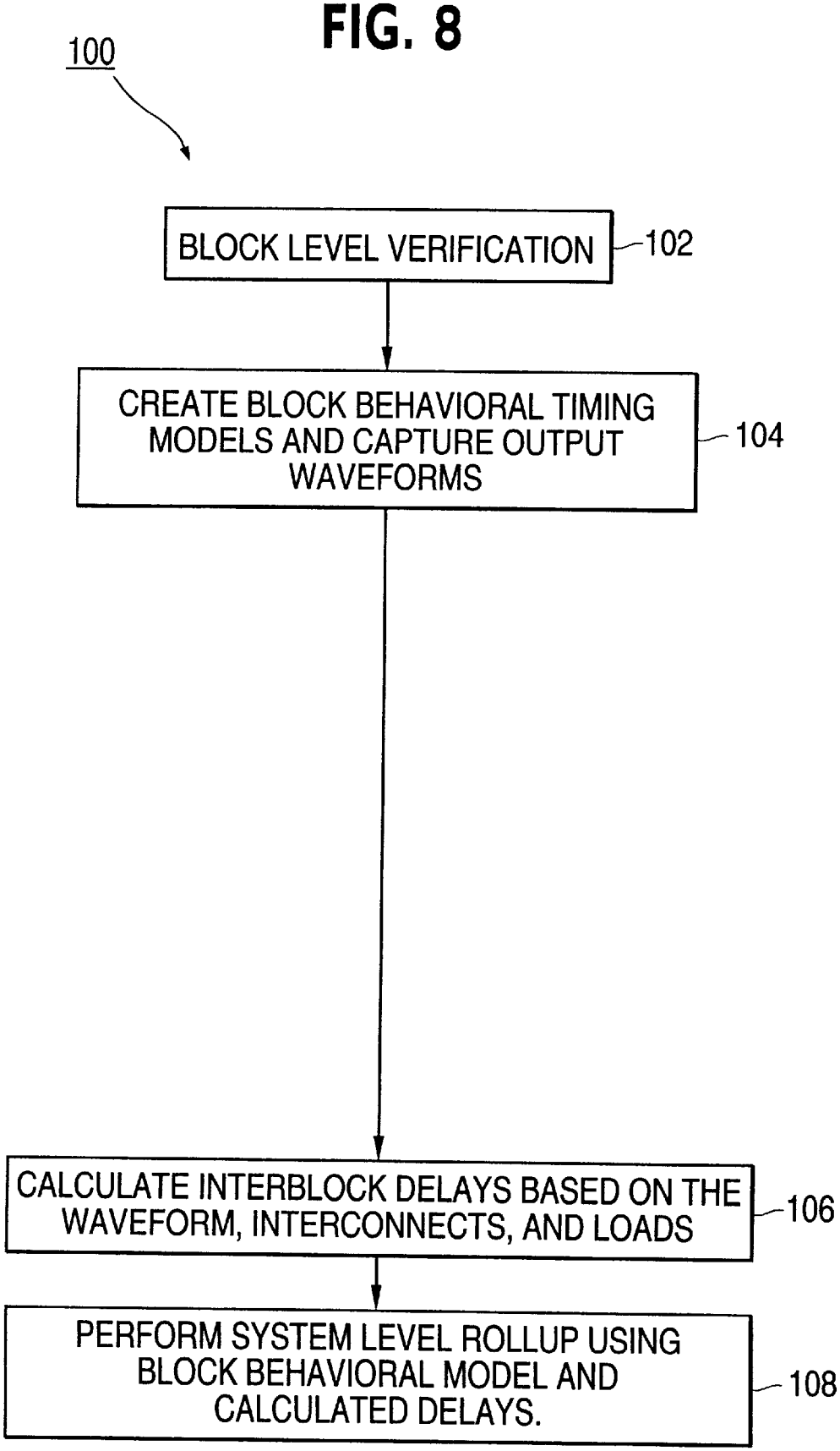
FIG. 8 is a flowchart showing a method of full-chip verification/analysis according to an example embodiment of the present invention.

Embodiments of the present invention will now be described with respect to the flowchart 100 of FIG. 8. That is, during testing of each of the individual blocks (block 102 in FIG. 8), the waveform output from a respective block (such as the pin 56) may be stored in memory of the computer system 200 (block 104 of FIG. 8). During analysis of the full-chip design, in order to determine the interblock performance, this stored data may be replicated by the model and be represented as the time dependent voltage source 96 coupled to the pin 56. The time dependent voltage source 96 may thereby reproduce a substantially similar (or approximately similar) waveform at the output pin 56. Overall features of the interconnect 57 such as a signal delay of the interconnect 57, a signal strength on the interconnect 57, and a slope of signals on the interconnect 57 may thereby be determined. That is, interblock delays may be calculated based on the waveform, interconnects and loads (block 106 in FIG. 8). The full-chip testing may be performed using the block behavioral model and the calculated delays (block 108 of FIG. 8).

The interblock performance analysis/verification flow of embodiments of the present invention may utilize simpler data management, enable the use of more efficient delay calculation techniques and alleviate debugging difficulties. Overall, the interconnect features may be determined more effectively and efficiently and the overall productivity and efficiency of the design process may be improved.

Embodiments of the present invention may utilize the substitution theorem from circuit theory for interblock or system level performance analysis and verification (e.g. full-chip timing). This provides advantages over disadvantageous arrangements in which performance verification may involve the extraction of driver and intrablock parasitics and stitching to produce driver-interconnect-load stage models.

Embodiments of the present invention may provide a method for testing a full-chip design. This method may involve testing the first block and capturing data output from the first block during the testing. Features of an interconnect may be determined by using the captured data. These features may include a delay of the interconnect, a strength of the signal on the interconnect and a slope of the signal on the interconnect. This stored data may relate to a first waveform output from the first block during testing. Performance analysis/verification may be determined based on at least the determined features of the interconnect.

A program storage device may be provided to store a program of instructions that are executable by a machine (such as a processor device) that performs the above-described embodiments. Embodiments of the present invention may be performed within a computer system using a model of the full-chip design.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A method comprising:
   performing a first analysis on a first block of a full-chip design;
   capturing data relating to said first block while performing said first analysis; and
   utilizing said captured data to determine features of an interconnect between said first block and a second block of said full-chip design when performing a second analysis of said full-chip design, said second analysis relating to features of said full-chip design greater than said first block.

2. The method of claim 1, wherein capturing said data comprises storing data regarding a waveform output from said first block while performing said first analysis.

3. The method of claim 1, wherein said features of said interconnect comprise one of a delay of said interconnect, a strength of a signal on said interconnect, and a slope of said signal on said interconnect.

4. The method of claim 1, wherein said captured data relates to a waveform obtained while performing said first analysis on said first block.

5. The method of claim 1, wherein said method is performed by a computer system on a model of said full-chip design.

6. The method of claim 1, wherein said first block represents a component of said full-chip design.

7. A performance verification/analysis method comprising:
   performing a first analysis on a first block of a full-chip design;
   capturing data relating to said first block while performing said first analysis; and
   determining features of an interconnect using said captured data, said interconnect provided between said first block and a second block of said full-chip design.

8. The method of claim 7, further comprising performing a second analysis of said full-chip design by using said determined features, said second analysis relating to features of said full-chip design greater than said first block.

9. The method of claim 7, wherein capturing said data comprises storing data regarding a waveform output from said first block while performing said first analysis.

10. The method of claim 9, wherein determining said features of said interconnect comprises using said captured data regarding said waveform.

11. The method of claim 9, wherein said features of said interconnect comprise one of a delay of said interconnect, a strength of a signal on said interconnect, and a slope of said signal on said interconnect.

12. The method of claim 11, wherein said first block represents a component of said full-chip design.

13. An apparatus comprising:
    a machine-accessible medium including instructions that, when executed by a machine, cause the machine to perform a method comprising:
      performing a first analysis on a first block of a full-chip design;
      capturing data relating to said first block while performing said first analysis; and
      utilizing said captured data to determine features of an interconnect between said first block and a second block of said full-chip design when performing a second analysis of said full-chip design, said second analysis relating to features of said full-chip design greater than said first block.

14. The apparatus of claim 13, further comprising a storage device, wherein capturing said data comprises storing data in said storage device regarding a waveform output from said first block while performing said first analysis.

15. The apparatus of claim 13, wherein said features comprise one of a delay of said interconnect, a strength of a signal on said interconnect, and a slope of said signal on said interconnect.

16. The apparatus of claim 13, wherein said captured data relates to a waveform obtained while performing said first analysis on said first block.

17. The apparatus of claim 13, wherein said first block represents a component of said full-chip design.

18. A method comprising
    performing an analysis on a first block of a chip design;
    storing data regarding a waveform from said first block based on said analysis on said first block; and
    determining features of an interconnect between said first block and a second block of said chip design by using said stored data regarding said waveform.

19. The method of claim 18, wherein said features of said interconnect comprise one of a delay of said interconnect, a strength of a signal on said interconnect, and a slope of said signal on said interconnect.

* * * * *